United States Patent
Tsunomura et al.

(10) Patent No.: US 9,905,710 B2
(45) Date of Patent: Feb. 27, 2018

(54) SOLAR CELL

(71) Applicant: Panasonic Intellectual Property Management Co., Ltd., Osaka (JP)

(72) Inventors: Yasufumi Tsunomura, Osaka (JP); Toshiaki Baba, Osaka (JP); Takayoshi Sone, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/838,560

(22) Filed: Aug. 28, 2015

(65) Prior Publication Data

US 2015/0372166 A1 Dec. 24, 2015

Related U.S. Application Data

(63) Continuation of application No. PCT/JP2013/082205, filed on Nov. 29, 2013.

(30) Foreign Application Priority Data

Mar. 28, 2013 (JP) .................................. 2013-068683

(51) Int. Cl.
*H01L 31/00* (2006.01)
*H01L 31/0236* (2006.01)
*H01L 31/0747* (2012.01)

(52) U.S. Cl.
CPC .... *H01L 31/02363* (2013.01); *H01L 31/0747* (2013.01); *Y02E 10/50* (2013.01)

(58) Field of Classification Search
CPC .......................... H01L 31/02363; H01L 31/074

(Continued)

(56) References Cited

U.S. PATENT DOCUMENTS

2001/0029978 A1* 10/2001 Nakai ............. H01L 31/035281
                                                        136/258
2009/0020154 A1* 1/2009 Sheng ............... H01L 31/03685
                                                        136/255

(Continued)

FOREIGN PATENT DOCUMENTS

WO     2011/034145 A1    3/2011

OTHER PUBLICATIONS

Extended European Search Report dated Jan. 5, 2017 for European Patent Application No. 13880637.7.

*Primary Examiner* — Niki Bakhtiari
(74) *Attorney, Agent, or Firm* — Metrolexis Law Group, PLLC

(57) ABSTRACT

An embodiment of a solar cell is provided comprising a silicon substrate, on a first surface of which a texture structure including mountain portions and valley portions is formed, and an amorphous silicon layer provided on the first surface of the silicon substrate. The texture structure, in a cross section passing through the mountain portions and the valley portions, includes pairs of slant portions, each pair slanting to extend from a pair of neighboring ones of the mountain portions toward the valley portion therebetween while coming closer to each other. The valley portion located between the slant portions is in a round shape with a radius of curvature of 150 nm or smaller. The amorphous silicon layer includes an epitaxial growth area grown from the valley portion, the epitaxial growth area on the valley portion is thicker than that on a region other than the valley portion.

17 Claims, 5 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2010/0148318 A1* | 6/2010 | Wang | H01L 31/0236 257/627 |
| 2011/0000545 A1* | 1/2011 | Nishi | H01L 31/022433 136/261 |
| 2011/0174371 A1 | 7/2011 | Olibet et al. | |
| 2012/0132264 A1 | 5/2012 | Chen et al. | |
| 2012/0192914 A1 | 8/2012 | Fujishima et al. | |
| 2012/0211079 A1* | 8/2012 | Hekmatshoar-Tabari | H01L 31/18 136/258 |
| 2012/0288985 A1 | 11/2012 | Moriceau et al. | |

\* cited by examiner

SOLAR CELL

CROSS REFERENCE TO RELATED APPLICATIONS

This application is a continuation application of International Application No. PCT/JP2013/082205, filed on Nov. 29, 2013, entitled "SOLAR CELL", which claims priority based on the Article 8 of Patent Cooperation Treaty from prior Japanese Patent Applications No. 2013-068683, filed on Mar. 28, 2013, the entire contents of which are incorporated herein by reference.

BACKGROUND

The disclosure relates to a solar cell.

A method of enhancing the efficiency of power generation of a solar cell is known which involves forming asperities called a texture structure on the light-receiving surface of the solar cell to reduce the reflection of light and at the same time to increase the amount of light entering the inside of the solar cell. Moreover, a solar cell is known which includes a substrate with a texture structure formed thereon and amorphous silicon layers formed on the substrate (See International Patent Application Publication No. WO2011/034145 Pamphlet (Patent Document 1)).

SUMMARY

An embodiment of a solar cell is provided comprising a silicon substrate, on a first surface of which a texture structure including mountain portions and valley portions is formed, and an amorphous silicon layer provided on the first surface of the silicon substrate. The texture structure, in a cross section passing through the mountain portions and the valley portions, includes pairs of slant portions, each pair slanting to extend from a pair of neighboring ones of the mountain portions toward the valley portion therebetween while coming closer to each other. The valley portion located between the slant portions is in a round shape with a radius of curvature of 150 nm or smaller. The amorphous silicon layer includes an epitaxial growth area grown from the valley portion, the epitaxial growth area on the valley portion is thicker than that on a region other than the valley portion.

DETAILED DESCRIPTION

Figure 1:
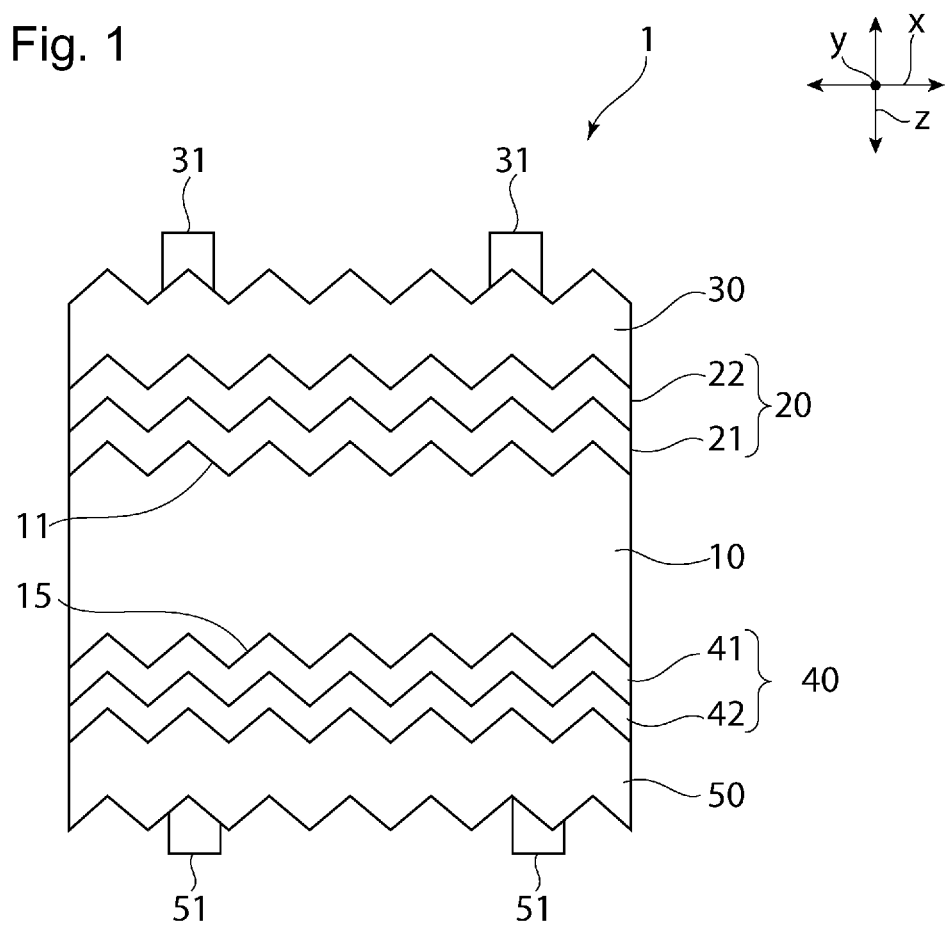
FIG. 1 is a schematic cross-sectional view illustrating a solar cell of one embodiment.

Embodiments are described below. It is to be noted that the following embodiments are mere examples, and the invention is not limited to the following embodiments. Moreover, in the drawings, members with substantially the same function may be referred to by the same reference numeral.

FIG. 1 is a schematic cross-sectional view illustrating a solar cell of one embodiment. As illustrated in FIG. 1, solar cell 1 includes silicon substrate 10. Texture structures are formed on front surface 11 and back surface 15 of silicon substrate 10. Silicon substrate 10 may be made of monocrystalline silicon or be made of polycrystalline silicon. In this embodiment, silicon substrate 10 is an n-type monocrystalline silicon substrate. Amorphous silicon layer 20 is provided on front surface 11. Amorphous silicon layer 20 includes i-type amorphous silicon thin film 21 formed on front surface 11 as a first amorphous silicon film and p-type amorphous silicon thin film 22 formed on i-type amorphous silicon thin film 21 as a second amorphous silicon film.

Amorphous silicon layer 40 is provided on back surface 15. Amorphous silicon layer 40 includes i-type amorphous silicon thin film 41 formed on back surface 15 as a first amorphous silicon film and n-type amorphous silicon thin film 42 formed on i-type amorphous silicon thin film 41 as a second amorphous silicon film.

Translucent or transparent electrode 30 is provided on amorphous silicon layer 20. Likewise, translucent or transparent electrode 50 is provided on amorphous silicon layer 40. Metal electrodes 31 are provided on transparent electrode 30. Likewise, metal electrodes 51 are provided on transparent electrode 50.

I-type amorphous silicon thin film 21 is a hydrogen-containing amorphous intrinsic silicon semiconductor thin film, for example. Here, the intrinsic semiconductor thin film is a semiconductor thin film in which the concentration of the p-type or n-type dopant contained is $5 \times 10^{18}/cm^3$ or lower. Alternatively, in the case where both p-type and n-type dopants are contained, it is a semiconductor thin film in which the difference of the concentration of the p-type or n-type dopant is $5 \times 10^{18}/cm^3$ or smaller. I-type amorphous silicon thin film 21 is preferably formed to be thin such that its absorption of light is minimized but the front surface of silicon substrate 10 is still sufficiently passivated. The thickness of i-type amorphous silicon thin film 21 is between 1 nm and 25 nm, both inclusive, and preferably between 5 nm and 10 nm, both inclusive.

I-type amorphous silicon thin film 21 can be formed by plasma-enhanced chemical vapor deposition (PECVD), CAT-CVD (Catalytic Chemical Vapor Deposition), sputtering, and the like. As the PECVD, any of methods such as RF plasma-enhanced CVD, high-frequency VHF plasma-enhanced CVD, and microwave plasma-enhanced CVD may be used. In this embodiment, a case using RF plasma-enhanced CVD is described. For example, as illustrated in Table 1, i-type amorphous silicon thin film 21 can be formed by: supplying a silicon-containing gas, such as silane ($SiH_4$), which is diluted with hydrogen; applying an RF high-frequency power to parallel-plate electrodes or the like to transform the gas into a plasma; and supplying the plasma onto the film formation surface of silicon substrate 10 which is heated. The substrate temperature during the film formation is between 150° C. and 250° C., both inclusive, and the RF specific power is between 1 mW/cm² and 10 mW/cm², both inclusive.

P-type amorphous silicon thin film 22 is an amorphous semiconductor film containing a p-type conductive dopant. For example, p-type amorphous silicon thin film 22 is made from hydrogen-containing amorphous silicon. The concentration of the p-type dopant in p-type amorphous silicon thin film 22 is higher than that of i-type amorphous silicon thin film 21. For example, the concentration of the p-type dopant in p-type amorphous silicon thin film 22 is preferably $1 \times 10^{20}/cm^3$ or higher. The thickness of p-type amorphous silicon thin film 22 is preferably small such that its absorption of light can be minimized, but also preferably such that carriers generated in silicon substrate 10 can be effectively separated at a pn junction and the generated carriers can be efficiently collected at transparent conductive layer 30.

P-type amorphous silicon thin film 22 can also be formed by PECVD, CAT-CVD, sputtering, and the like. As the PECVD, RF plasma-enhanced CVD can be employed. For example, as illustrated in Table 1, p-type amorphous silicon thin film 22 can be formed by: supplying a silicon-containing gas, such as silane ($SiH_4$), and a p-type dopant-containing gas, such as diborane ($B_2H_6$), which are diluted with hydrogen; applying an RF high-frequency power to parallel-plate electrodes or the like to transform the gases into plasmas; and supplying the plasmas onto i-type amorphous silicon thin film 21 on silicon substrate 10 which is heated. Note that in Table 1, the diborane ($B_2H_6$) is diluted with hydrogen by 1%. The substrate temperature during the film formation is preferably between 150° C. and 250° C., both inclusive, and the RF specific power is preferably between 1 mW/cm² and 10 mW/cm², both inclusive.

I-type amorphous silicon thin film 41 is formed on the back surface of silicon substrate 10. Specifically, after i-type amorphous silicon thin film 21 and p-type amorphous silicon thin film 22 are formed, silicon substrate 10 is turned upside down, and i-type amorphous silicon thin film 41 is formed on the back surface of silicon substrate 10. I-type amorphous silicon thin film 41 is, for example, a hydrogen-containing amorphous silicon intrinsic silicon semiconductor thin film. The thickness of i-type amorphous silicon thin film 41 is between 1 nm and 25 nm, both inclusive, and preferably between 5 nm and 10 nm, both inclusive, as in the case of i-type amorphous silicon thin film 21.

I-type amorphous silicon thin film 41 can be formed by PECVD, CAT-CVD, sputtering, and the like. As the PECVD, RF plasma-enhanced CVD can be employed. For example, as illustrated in Table 1, i-type amorphous silicon thin film 41 can be formed by: supplying a silicon-containing gas, such as silane ($SiH_4$), which is diluted with hydrogen; applying an RF high-frequency power to parallel-plate electrodes or the like to transform the gas into a plasma; and supplying the plasma onto the film formation surface of silicon substrate 10 which is heated. The substrate temperature during the film formation is between 150° C. and 250° C., both inclusive, and the RF specific power is between 1 mW/cm² and 10 mW/cm², both inclusive, as in the case of i-type amorphous silicon thin film 21.

N-type amorphous silicon thin film 42 is an amorphous semiconductor film containing an n-type conductive dopant. For example, n-type amorphous silicon thin film 42 is made from hydrogen-containing amorphous silicon. The concentration of the n-type dopant in n-type amorphous silicon thin film 42 is set higher than that of i-type amorphous silicon thin film 41. The concentration of the n-type dopant in n-type amorphous silicon thin film 42 is preferably $1 \times 10^{20}/cm^3$ or higher, for example. The thickness of n-type amorphous silicon thin film 42 is preferably small such that its absorption of light can be minimized, but also preferably such that carriers generated in silicon substrate 10 are effectively separated by a BSF (Back Surface Field) structure and the generated carriers can be efficiently collected at transparent electrode 50.

N-type amorphous silicon thin film 42 can also be formed by PECVD, CAT-CVD, sputtering, and the like. As the PECVD, RF plasma-enhanced CVD can be employed. For example, as illustrated in Table 1, n-type amorphous silicon thin film 42 can be formed by: supplying a silicon-containing gas, such as silane ($SiH_4$), and a n-type dopant-containing gas, such as phosphine ($PH_3$), which are diluted with hydrogen; applying an RF high-frequency power to parallel-plate electrodes or the like to transform the gases into plasmas; and supplying the plasmas onto i-type amorphous silicon thin film 41 on silicon substrate 10 which is heated. Note that in Table 1, the phosphine ($PH_3$) is diluted with hydrogen by 2%. The substrate temperature during the film formation is preferably between 150° C. and 250° C., both inclusive, and the RF specific power is preferably between 1 mW/cm² and 10 mW/cm², both inclusive.

Note that it is optional to set the front surface side of silicon substrate 10 as the light-receiving surface (the surface to which light is introduced mainly from outside) or to set the back surface side thereof as the light-receiving surface. Also, in the above embodiment, i-type amorphous silicon thin film 21 and p-type amorphous silicon thin film 22 on the front surface side are formed, and thereafter silicon substrate 10 is turned upside down and i-type amorphous silicon thin film 41 and n-type amorphous silicon thin film 42 on the back surface side are formed, but they may be formed in any other suitable order.

TABLE 1

| | Process | Substrate Temperature [° C.] | Gas | Pressure [Pa] | Specific Power [mW/cm²] |
| --- | --- | --- | --- | --- | --- |
| Front Surface | i-type Amorphous Silicon Thin Film 21 | 150-250 | $H_2$: 100-300 sccm $SiH_4$: 10-50 sccm | 10-100 | 1-10 |
| | p-type Amorphous Silicon Thin Film 22 | 150-250 | $H_2$: 100-300 sccm $SiH_4$: 10-50 sccm $B_2H_6$: 10-50 sccm | 10-100 | 1-10 |
| Back Surface | i-type Amorphous Silicon Thin Film 41 | 150-250 | $H_2$: 100-300 sccm $SiH_4$: 10-50 sccm | 10-100 | 1-10 |
| | n-type Amorphous Silicon Thin Film 42 | 150-250 | $H_2$: 100-300 sccm $SiH_4$: 10-50 sccm $PH_3$: 10-50 sccm | 10-100 | 1-10 |

Transparent electrodes 30 and 50 can be made from a transparent conductive oxide such as indium tin oxide (ITO), for example. Metal electrodes 31 and 51 can be made from a metal such as Ag, Cu, or Sn, or an alloy containing at least one of these metals, for example.

In this embodiment, i-type amorphous silicon thin films 21 and 41 are provided in amorphous silicon layers 20 and 40, respectively, but the invention is not necessarily limited to this structure. For example, amorphous silicon layer 20 may be formed only of p-type amorphous silicon thin film 22, and amorphous silicon layer 40 may be formed only of n-type amorphous silicon thin film 42.

In this embodiment, an n-type monocrystalline silicon substrate is used as silicon substrate 10, but a p-type monocrystalline silicon substrate may instead be used. In this case, p-type amorphous silicon thin film 22 is of the same conductivity type as the conductivity type of silicon substrate 10, and n-type amorphous silicon thin film 42 is of the opposite conductivity type from the conductivity type of silicon substrate 10. Note that a polycrystalline silicon substrate and the like may be used besides a monocrystalline silicon substrate.

In this embodiment, transparent electrode 50 is provided on the rear surface 15 side, so that a solar cell configured to receive light from both sides is provided. However, a non-transparent electrode such as a metal electrode may be provided instead of transparent electrode 50, so that a solar cell configured to receive light only from the front surface 11 side is provided. There is no need to provide metal electrodes 51 in the case where a metal electrode is provided instead of transparent electrode 50.

Figure 2:
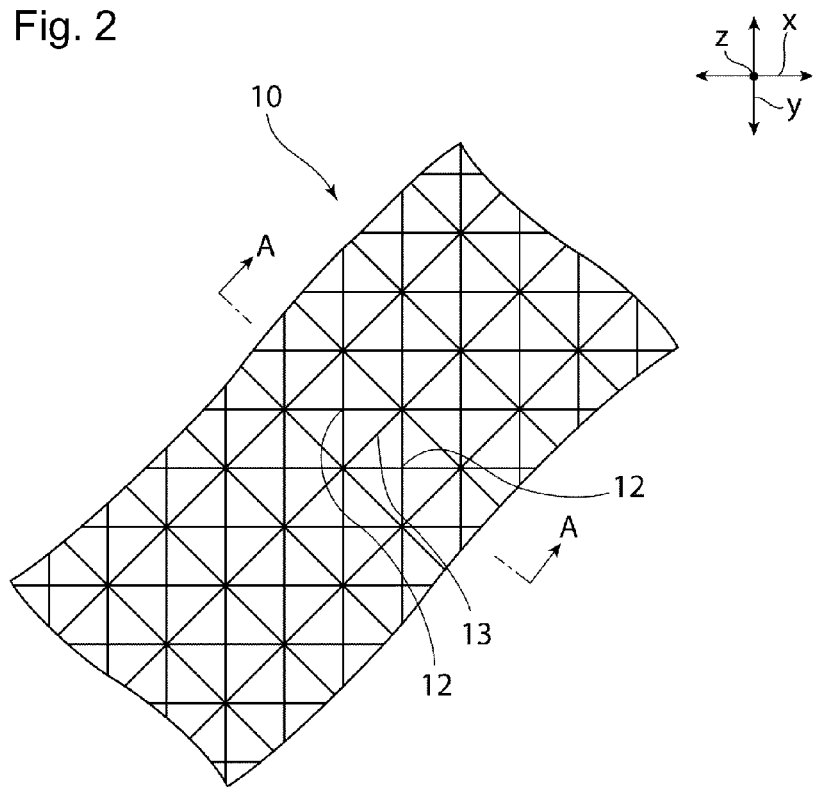
FIG. 2 is a schematic plan view illustrating a texture structure on the front surface of a silicon substrate in the embodiment illustrated in FIG. 1.
Figure 3:
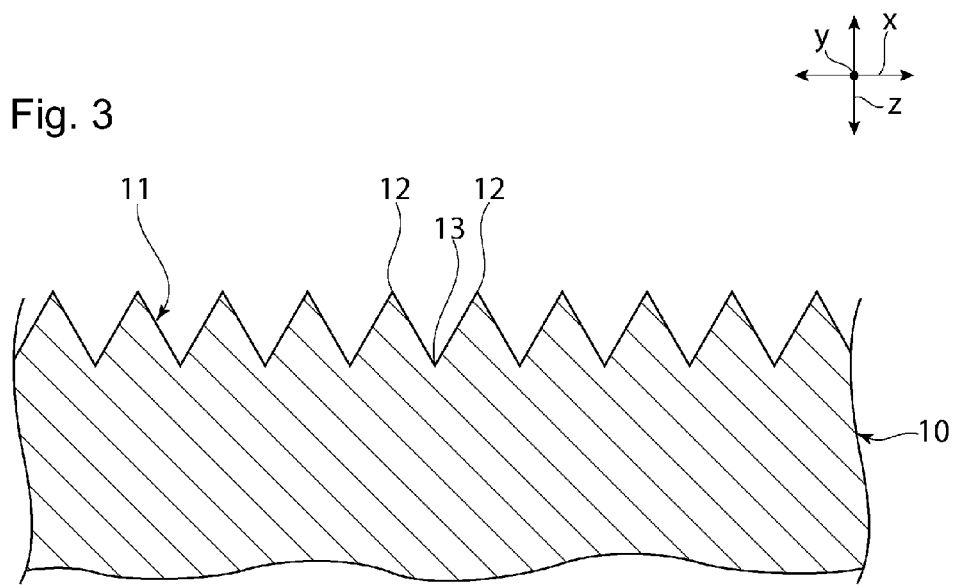
FIG. 3 is a schematic cross-sectional view illustrating the texture structure on the front surface of the silicon substrate in the embodiment illustrated in FIG. 1.

FIG. 2 is a schematic plan view illustrating the texture structure on the front surface of the silicon substrate in the embodiment illustrated in FIG. 1. FIG. 3 is a schematic cross-sectional view illustrating the texture structure on the front surface of the silicon substrate in the embodiment illustrated in FIG. 1. FIG. 3 is a cross-sectional view taken along line A-A illustrated in FIG. 2 and is a cross-sectional view passing through mountain portions 12 and valley portions 13. As illustrated in FIG. 3, a texture structure including mountain portions 12 and valley portions 13 is formed on front surface 11. As illustrated in FIGS. 2 and 3, each mountain portion 12 is in a pyramid shape, and a pair of neighboring mountain portions 12 form valley portion 13 therebetween.

The texture structure including mountain portions 12 and valley portions 13 can be formed by performing anisotropic etching on the (100) plane of silicon substrate 10 using an alkaline aqueous solution such as a sodium hydroxide (NaOH) aqueous solution, a potassium hydroxide (KOH) aqueous solution, or a tetramethylammonium hydroxide (TMAH), for example. By immersing silicon substrate 10 with a (100) plane in such an alkaline solution, anisotropic etching occurs along the (111) plane, so that many pyramid shaped mountain portions 12 are formed in front surface 11 of silicon substrate 10. The concentration of the alkaline aqueous solution contained in the etchant is preferably 1.0% by weight to 7.5% by weight. After the texture structure including mountain portions 12 and valley portions 13 is formed, isotropic etching is performed on front surface 11 of silicon substrate 10. In this way, valley portions 13 of front surface 11 of silicon substrate 10 can be rounded. As the isotropic etching, it is possible employ wet etching using a mixed solution of hydrofluoric acid (HF) and nitric acid ($HNO_3$) or a mixed solution of hydrofluoric acid (HF), nitric acid ($HNO_3$), and acetic acid ($CH_3COOH$) or dry etching using a mixed gas of tetrafluoromethane ($CF_4$) and oxygen ($O_2$), and the radius of curvature of each valley portion 13 can be adjusted by controlling the mixing ratio of the materials and the process time. At the same time, mountain portions 12 and the ridges of the texture structure may also be rounded by the isotropic etching.

Figure 4:
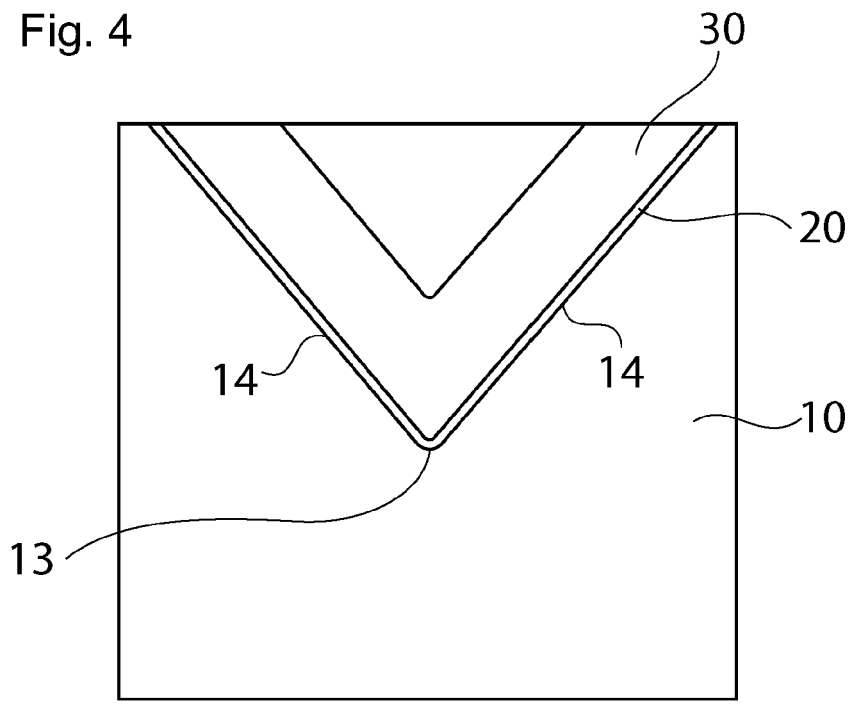
FIG. 4 is an enlarged cross-sectional view illustrating a valley portion of the texture structure on the solar cell of the embodiment.

FIG. 4 is an enlarged cross-sectional view illustrating a valley portion of the texture structure on the solar cell of the embodiment. The cross-sectional view in FIG. 4 illustrates a cross section passing through a pair of neighboring mountain portions 12 and the valley portion 13 therebetween, as in the cross-sectional view in FIG. 3. Slant portions 14 illustrated in FIG. 4 are formed between mountain portions 12 and valley portions 13 illustrated in FIGS. 2 and 3. As illustrated in FIG. 4, amorphous silicon layer 20 formed on the texture structure on the front surface of silicon substrate 10 is formed along the asperities of the texture structure. Likewise, transparent electrode 30 formed on amorphous silicon layer 20 is also formed along the asperities of the texture structure.

Figure 5:
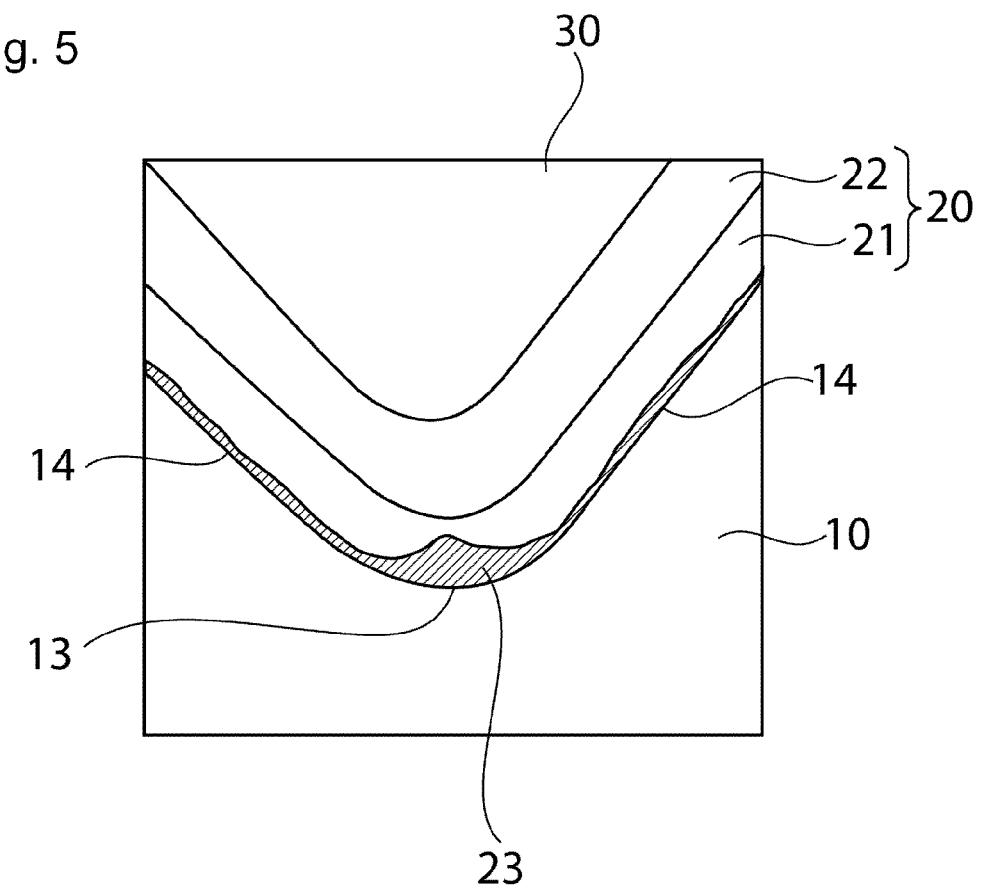
FIG. 5 is an enlarged cross-sectional view illustrating the valley portion of the texture structure on the solar cell of the embodiment.

FIG. 5 is a further enlarged cross-sectional view illustrating a valley portion of the texture structure on the solar cell of the embodiment. As illustrated in FIG. 5, amorphous silicon layer 20 includes epitaxial growth area 23 on valley portions 13 and slant portions 14. The thickness of epitaxial growth area 23 on valley portions 13 is larger than the thickness of epitaxial growth area 23 on slant portions 14. The thickness of epitaxial growth area 23 on valley portions 13 is a 1 nm to such a thickness that it reaches transparent electrode 30 (e.g. 10 nm). On the other hand, the thickness of epitaxial growth area 23 on slant portions 14 is 0 nm to 3 nm. Also, the width of epitaxial growth area 23 on valley portions 13 is within the range of the round shape of valley portions 13 (e.g. 1 nm to 100 nm), which is described later in detail. The thicknesses of epitaxial growth area 23 on valley portions 13 and slant portions 14 are the average thicknesses of the respective portions.

Epitaxial growth area 23 is superior in conductivity than amorphous areas which are the other remaining areas of amorphous silicon layer 20. Thus, by forming epitaxial growth area 23 on amorphous silicon layer 20, the resistive loss can be reduced and the fill factor (FF) can be improved. Accordingly, the efficiency of the power generation can be enhanced.

On the other hand, the open voltage (Voc) decreases as epitaxial growth area 23 increases. In this embodiment, the formation of epitaxial growth area 23 is accelerated selectively on valley portions 13. In this way, the decrease in open voltage (Voc) can be reduced. Thus, in this embodiment, it is possible to improve the fill factor while reducing the decrease in open voltage. In view of the above, the thickness of epitaxial growth area 23 on valley portions 13 is preferably larger than the thickness of epitaxial growth area 23 on slant portions 14, as mentioned above. In addition, epitaxial growth area 23 may not substantially be formed on slant portions 14.

If epitaxial growth area 23 reaches transparent electrode 30, leakage current is generated, which may possibly reduce the advantageous effect of the embodiment. For this reason, epitaxial growth area 23 does preferably not reach transparent electrode 30. However, the invention is not necessarily limited to such a structure, and epitaxial growth area 23 may reach transparent electrode 30.

In view of the above, epitaxial growth area 23 is most preferably formed up to the inside of i-type amorphous silicon thin film 21, as illustrated in FIG. 5. However, epitaxial growth area 23 may be formed up to the inside of p-type amorphous silicon thin film 22, and also be formed to reach transparent electrode 30.

The reason why the formation of epitaxial growth area 23 is selectively accelerated in this embodiment is described below.

As mentioned above, the texture structure can be formed on front surface 11 of silicon substrate 10 by anisotropic etching of silicon substrate 10. After this, in this embodiment, the following step (1) and step (2) are performed.

Step (1) is a step of removing a naturally oxidized film formed on front surface 11 of silicon substrate 10 by hydrogen plasma processing.

The naturally oxidized film is removed by adjusting the temperature of silicon substrate 10 within a range of 150 to 250° C., the flow rate of $H_2$ within a range of 100 to 300 sccm, the pressure within 10 to 100 Pa, and the specific power within a range of 1 to 10 mW/cm$^2$. By this processing, a monocrystalline silicon surface of silicon substrate 10 oriented mainly in the direction of (111) is considered to be formed on slant portions 14 of silicon substrate 10, and a monocrystalline silicon surface of silicon substrate 10 oriented mainly in the direction of (100) is considered to be formed on valley portions 13.

Step (2) is a step of performing hydrogen plasma processing with a small amount of $SiH_4$ gas added, after step (1).

Epitaxial growth area 23 is formed by adjusting the temperature of silicon substrate 10 within a range of 150 to 250° C., the flow rate of $H_2$ within a range of 100 to 300 sccm, the flow rate of $SiH_4$ within a range of 0.01 to 1 sccm, the pressure within 10 to 100 Pa, and the specific power within a range of 1 to 10 mW/cm$^2$. Since the epitaxial growth rate is higher on the (100) plane than on the (111) plane, epitaxial growth area 23 is considered to be formed selectively on valley portions 13 of silicon substrate 10. The thickness of epitaxial growth area 23 can be controlled by adjusting the process time.

Figure 6:
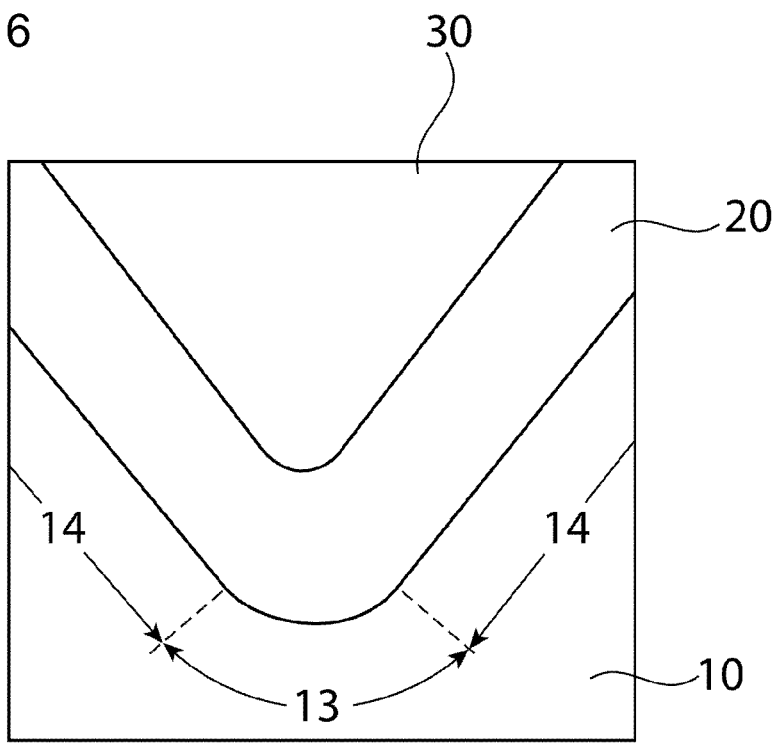
FIG. 6 is a cross-sectional view for explaining a round shape at the valley portion of the texture structure.
Figure 7:
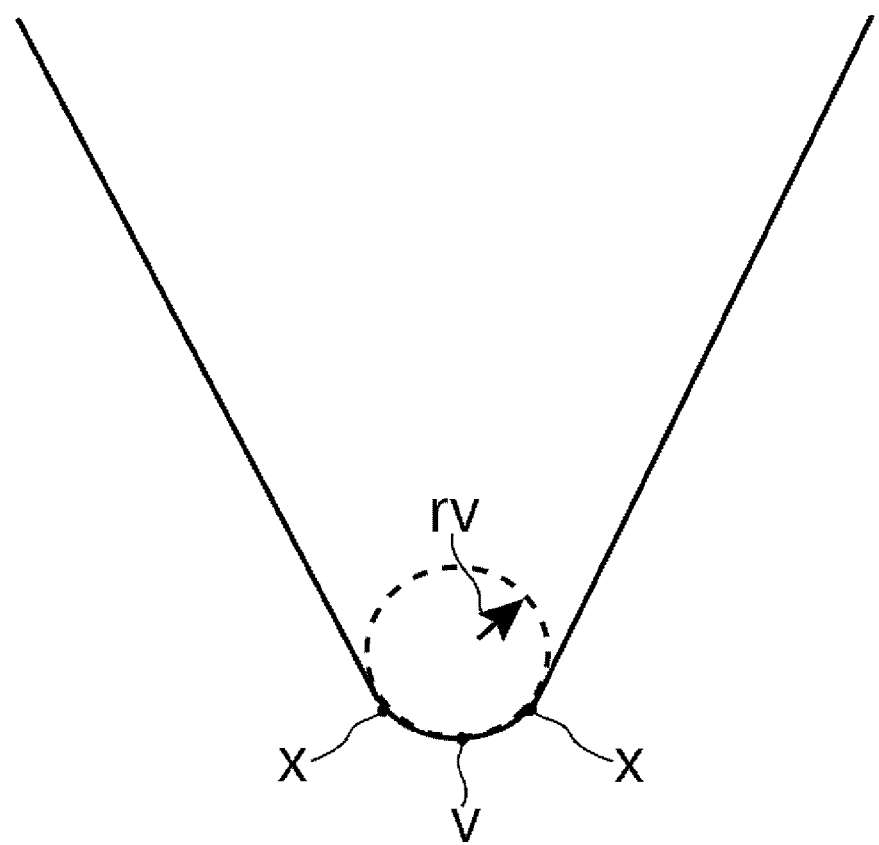
FIG. 7 is a cross-sectional view for explaining the round shape at the valley portion of the texture structure.

FIG. 6 is a cross-sectional view for explaining a round shape at each valley portion of the texture structure. In this embodiment, each valley portion 13 is in a round shape. Valley portion 13 is an area located between slant portions 14, which are substantially straight. The radius of curvature of the round shape of valley portion 13 is 150 nm or smaller. With the round shape with a radius of curvature of 150 nm or smaller, epitaxial growth can easily occur selectively at the small area of valley portion 13. The radius of curvature of the round shape of valley portion 13 is more preferably 100 nm or smaller and particularly preferably in a range of 1 to 50 nm. Here, as illustrated in FIG. 7, radius of curvature rv of the valley portion of the texture structure is the radius of an arc including points x and valley v at which the gradient of the slant surface of the pyramid defining the texture structure including the mountain portion and the valley portion shifts.

Another Embodiment

Figure 8:
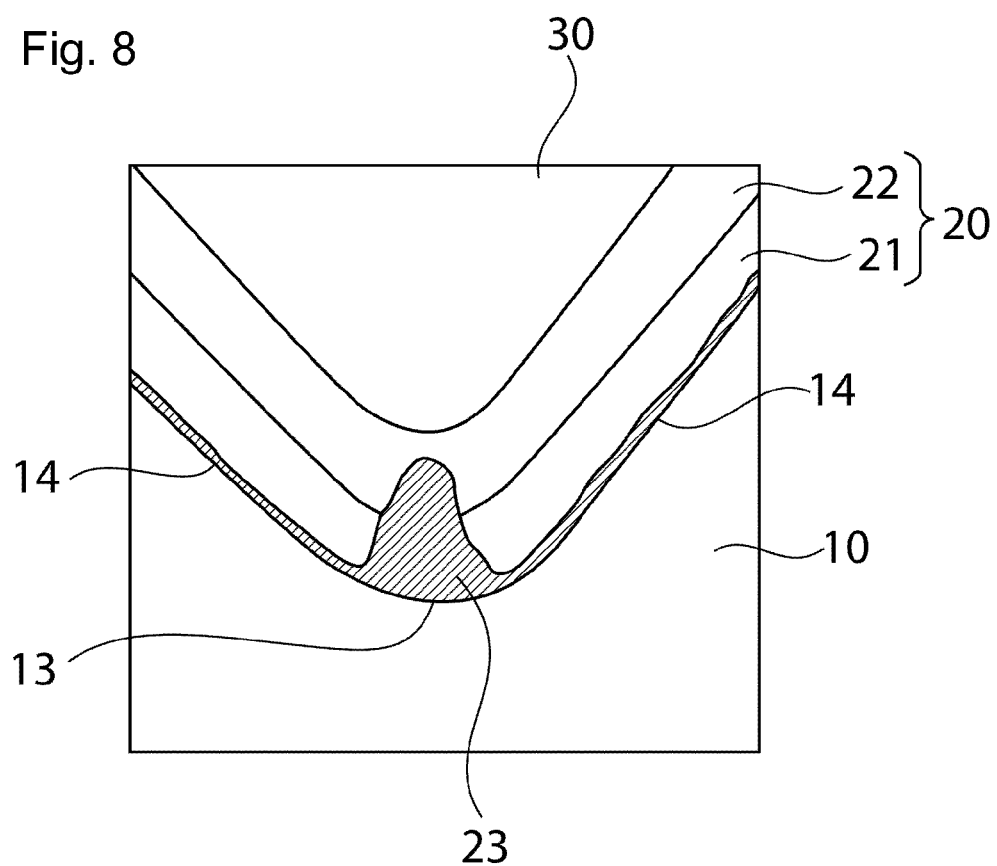
FIG. 8 is an enlarged cross-sectional view illustrating a valley portion of a texture structure on a solar cell of another embodiment.

FIG. 8 is an enlarged cross-sectional view illustrating a valley portion of a texture structure on a solar cell of another embodiment. In the embodiment illustrated in FIG. 8, the thickness of epitaxial growth area 23 on valley portions 13 is larger than that in the embodiment illustrated in FIG. 5. As mentioned above, the thickness of epitaxial growth area 23 can be adjusted by adjusting the process time in step (2). In this embodiment, the process time is set longer than that in the embodiment illustrated in FIG. 5.

Comparative Example

Figure 9:
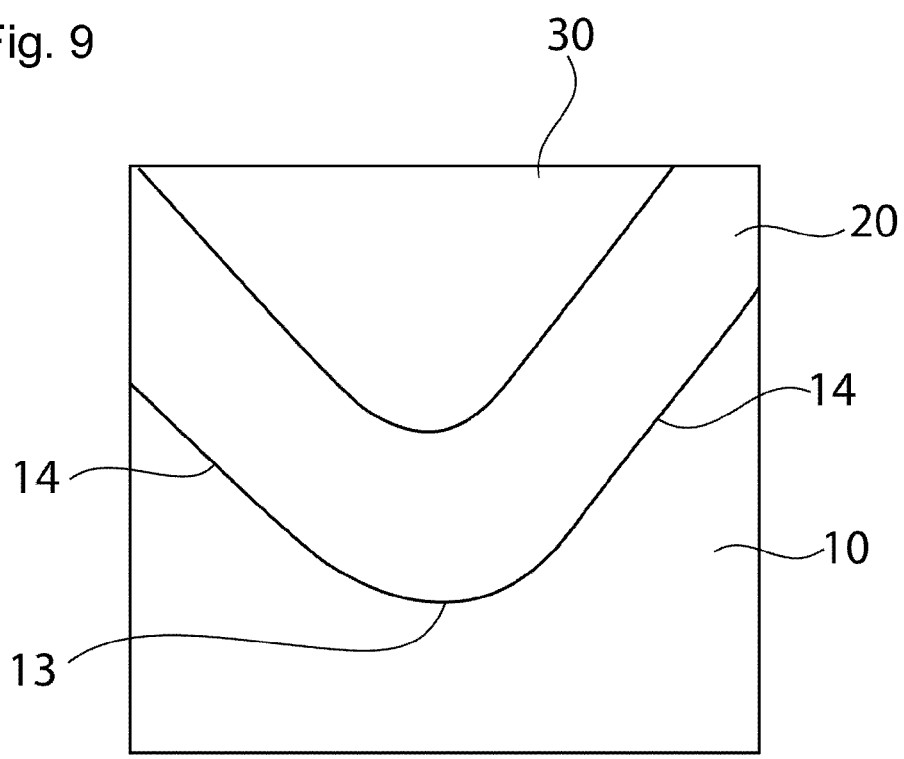
FIG. 9 is an enlarged cross-sectional view illustrating a texture structure on a solar cell of a comparative example.

FIG. 9 is an enlarged cross-sectional view illustrating a valley portion of a texture structure on a solar cell of a comparative example. In this comparative example, substantially no epitaxial growth area 23 is formed in amorphous silicon layer 20. In this comparative example, step (1) and step (2) mentioned above are not performed.

Epitaxial growth areas 23 illustrated in the cross sections in FIGS. 5, 8, and 9 can be viewed with a transmission electron microscopy. In a bright-field image, epitaxial growth areas 23 can be viewed as areas darker than the amorphous areas.

In the description of the above embodiments, amorphous silicon layer 20 on the front surface 11 side is described, but an epitaxial growth area is also formed in amorphous silicon layer 40 on the back surface 15 side similarly to epitaxial growth area 23. The thickness of epitaxial growth area 23 in amorphous silicon layer 20 on the front surface 11 side is preferably smaller than the thickness of epitaxial growth area 23 in amorphous silicon layer 40 on the back surface 15 side. This is because it is assumed that the electric field effect at the interface between silicon substrate 10 and i-type amorphous silicon thin film 21, 41 is more effective on the n-type amorphous silicon thin film 42 side during light irradiation, and the decrease in open voltage (Voc) by the increase of epitaxial growth area 23 is therefore reduced. Thus, in view of effectively improving the fill factor, epitaxial growth area 23 on the n-type amorphous silicon thin film 42 side is preferably made thicker than epitaxial growth area 23 on the p-type amorphous silicon thin film 22 side.

The solar cell of the invention is not limited to the solar cell of the embodiment illustrated in FIG. 1. The texture structure may be formed only on one of front surface 11 and back surface 15 of silicon substrate 10. Moreover, the epitaxial growth area may be formed only on one of the front surface 11 side and the back surface 15 side.

According to the embodiments described above, the efficiency of the power generation can be enhanced.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell comprising:
    a monocrystalline silicon substrate having a conductivity type, the monocrystalline silicon substrate including a first surface, wherein the first surface has a texture structure including mountain portions and valley portions; and
    an amorphous silicon layer provided on the first surface of the monocrystalline silicon substrate, wherein
    the texture structure, in a cross section passing through the mountain portions and the valley portions, including pairs of slant portions, each pair slanting to extend from a pair of neighboring ones of the mountain portions toward the valley portion therebetween while coming closer to each other,
    the valley portion located between the slant portions is in a round shape with a radius of curvature of 150 nm or smaller,
    wherein the amorphous silicon layer includes an epitaxial growth area on the valley portion and no epitaxial growth area on the slant portions, the conductivity of the epitaxial growth area being higher than that of the other area of the amorphous silicon layer.

2. The solar cell according to claim 1, wherein
    the amorphous silicon layer includes an amorphous silicon film separating from the first surface of the monocrystalline silicon substrate, the dopant concentration of the amorphous silicon film being $1 \times 10^{20}/cm^3$ or higher.

3. The solar cell according to claim 2, wherein
the amorphous silicon film has a different conductivity type from the conductivity type of the monocrystalline silicon substrate.

4. The solar cell according to claim 2, wherein
the amorphous silicon layer includes a substantially intrinsic amorphous silicon film provided on the first surface of the monocrystalline silicon substrate, and the amorphous silicon film provided on the substantially intrinsic amorphous silicon film,
the amorphous silicon film has a different conductivity type from the conductivity type of the monocrystalline silicon substrate, and
the epitaxial growth area on the valley portion extends through the substantially intrinsic amorphous silicon film.

5. The solar cell according to claim 2, wherein
the amorphous silicon film has the same conductivity type as the conductivity type of the monocrystalline silicon substrate.

6. The solar cell according to claim 2, wherein
the amorphous silicon layer includes a substantially intrinsic amorphous silicon film provided on the first surface of the monocrystalline silicon substrate, and the amorphous silicon film provided on the substantially intrinsic amorphous silicon film, and
the amorphous silicon film has the same conductivity type as the conductivity type of the monocrystalline silicon substrate.

7. A solar cell comprising:
a monocrystalline silicon substrate having a conductivity type, the monocrystalline silicon substrate including a first surface and a second surface opposite the first surface, each of the first and the second surfaces has texture structure including mountain portions and valley portions;
a first amorphous silicon layer provided on the first surface of the monocrystalline silicon substrate; and
a second amorphous silicon layer provided on the second surface of the monocrystalline silicon substrate, wherein
the texture structure, in a cross section passing through the mountain portions and the valley portions, includes pairs of slant portions, each pair slanting to extend from a pair of neighboring ones of the mountain portions toward the valley portion therebetween while coming closer to each other,
the valley portion located between the slant portions is in a round shape with a radius of curvature of 150 nm or smaller,
each of the first and second amorphous silicon layers provided on the first and second surface of the monocrystalline silicon substrate includes an epitaxial growth area on the valley portion and no epitaxial growth area on the slant portions.

8. The solar cell according to claim 7, wherein
the conductivity of the epitaxial growth areas on the valley portions on the first and second surfaces is higher than that of the other areas of the first and second amorphous silicon layers.

9. The solar cell according to claim 7, wherein
the first amorphous silicon layer includes a first amorphous silicon film separating from the first surface of the monocrystalline substrate, the dopant concentration of the first amorphous silicon film being $1 \times 10^{20}/cm^3$ or higher, and
the second amorphous silicon layer includes a second amorphous silicon film separating from the second surface of the monocrystalline substrate, the dopant concentration of the second amorphous silicon film being $1 \times 10^{20}/cm^3$ or higher.

10. The solar cell according to claim 9, wherein
the first amorphous silicon layer includes a substantially intrinsic first amorphous silicon film provided on the first surface of the monocrystalline silicon substrate, and the first amorphous silicon film provided on the substantially intrinsic first amorphous silicon film, and
the epitaxial growth area on the valley portion on the first surface reaches the first amorphous silicon film through the substantially intrinsic first amorphous silicon film.

11. The solar cell according to claim 10, wherein
the second amorphous silicon layer includes a substantially intrinsic second amorphous silicon film provided on the second surface of the monocrystalline silicon substrate, and the second amorphous silicon film provided on the substantially intrinsic second amorphous silicon film, and
the epitaxial growth area on the valley portion on the second surface does not reach the second amorphous silicon film through the substantially intrinsic second amorphous silicon film.

12. The solar cell according to claim 9, wherein
the conductivity type of the monocrystalline silicon substrate is an n-type,
the conductivity type of the first amorphous silicon film is the n-type, and
the conductivity type of the second amorphous silicon film is a p-type.

13. The solar cell according to claim 9, further comprising a transparent electrode on the first amorphous silicon film, wherein
the epitaxial growth area on the valley portion on the first surface reaches the transparent electrode through the first amorphous silicon film.

14. The solar cell according to claim 2, further comprising a transparent electrode on the amorphous silicon film, wherein
the epitaxial growth area reaches the transparent electrode through the amorphous silicon film.

15. The solar cell according to claim 2, wherein
the conductivity type of the monocrystalline silicon substrate is an n-type, and
the conductivity type of the amorphous silicon film is the n-type.

16. The solar cell according to claim 3, wherein
the monocrystalline silicon substrate includes a second surface opposite to the first surface, wherein the second surface including a texture structure including mountain portions, valley portions, and slant portions between the mountain portions and the valley portions, such that the valley portion located between the slant portions is in a round shape with a radius of curvature of 150 nm or smaller,
the solar cell further comprises an amorphous silicon layer provided on the second surface, wherein
the amorphous silicon layer on the second surface includes an epitaxial growth area on the valley portion of the second surface, and a thickness of the epitaxial growth area on the valley portion of the second surface is thicker than a thickness of the epitaxial growth area on the valley portion of the first surface.

17. The solar cell according to claim 4, wherein
the monocrystalline silicon substrate includes a second surface opposite to the first surface, wherein the second surface including a texture structure including mountain portions, valley portions, and slant portions between the mountain portions and the valley portions, such that the valley portion located between the slant portions is in a round shape with a radius of curvature of 150 nm or smaller,
the solar cell further comprises an amorphous silicon layer provided on the second surface, wherein
the amorphous silicon layer on the second surface includes an epitaxial growth area on the valley portion of the second surface, and
a thickness of the epitaxial growth area on the valley portion of the second surface is thicker than a thickness of the epitaxial growth area on the valley portion of the first surface.

* * * * *